(12) United States Patent
Nakagami et al.

(10) Patent No.: US 10,156,239 B2
(45) Date of Patent: Dec. 18, 2018

(54) INVERTER-INTEGRATED ELECTRICAL COMPRESSOR

(71) Applicant: MITSUBISHI HEAVY INDUSTRIES THERMAL SYSTEMS, LTD., Minato-ku, Tokyo (JP)

(72) Inventors: Takashi Nakagami, Tokyo (JP); Koji Nakano, Tokyo (JP); Keiji Nagasaka, Tokyo (JP); Hiroyuki Kamitani, Tokyo (JP); Makoto Hattori, Tokyo (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 270 days.

(21) Appl. No.: 14/646,231

(22) PCT Filed: Oct. 18, 2013

(86) PCT No.: PCT/JP2013/078267
§ 371 (c)(1),
(2) Date: May 20, 2015

(87) PCT Pub. No.: WO2014/103482
PCT Pub. Date: Jul. 3, 2014

(65) Prior Publication Data
US 2015/0285256 A1    Oct. 8, 2015

(30) Foreign Application Priority Data

Dec. 28, 2012  (JP) ................................. 2012-288763

(51) Int. Cl.
*F04D 25/06* (2006.01)
*F04B 39/12* (2006.01)
(Continued)

(52) U.S. Cl.
CPC ............ *F04D 25/06* (2013.01); *F04B 39/121* (2013.01); *F04D 25/068* (2013.01); *H02K 11/33* (2016.01);
(Continued)

(58) Field of Classification Search
CPC .... F04B 39/121; F04D 25/06; F04D 25/0633; F04D 25/068; H02K 11/33; H02M 7/003; H02M 7/537; H05K 7/209
See application file for complete search history.

(56) References Cited

U.S. PATENT DOCUMENTS 4,120,019 A * 10/1978 Arii ........................... F28F 1/20
                                                                 174/15.2
4,665,467 A *  5/1987 Speraw .................. H05K 7/209
                                                                 165/185
(Continued)

FOREIGN PATENT DOCUMENTS

CN         101187364 A     5/2008
CN         102045976 A     5/2011
(Continued)

OTHER PUBLICATIONS

Japanese Notification of Reasons for Rejection for Japanese Application No. 2012-288763, dated Dec. 6, 2016, with an English translation thereof.
(Continued)

*Primary Examiner* — Patrick Hamo
*Assistant Examiner* — Joseph Herrmann
(74) *Attorney, Agent, or Firm* — Birch, Stewart, Kolasch & Birch, LLP (57) ABSTRACT

The inverter-integrated electrical compressor is provided with an inverter-accommodating case (2) partitioned by a partitioning wall (3) and a low-pressure refrigerant channel inside a housing, an inverter device (1) being incorporated
(Continued)

within the inverter-accommodating case (2); wherein the inverter device (1) is provided with a plurality of high-voltage electric components (5, 6) constituting a filter circuit, a plurality of semiconductor switching elements (7), and a control substrate (8) on which an inverter circuit and a control circuit are mounted; and the plurality of semiconductor switching elements (7) are installed in a fixed manner on the side surfaces (17) of a heat-radiating block (16) provided perpendicularly relative to the partitioning wall (3).

15 Claims, 7 Drawing Sheets (51) Int. Cl.
*H05K 7/20* (2006.01)
*H02M 7/537* (2006.01)
*H02K 11/33* (2016.01)
*H02M 7/00* (2006.01)

(52) U.S. Cl.
CPC ............ *H02M 7/537* (2013.01); *H05K 7/209* (2013.01); *H02M 7/003* (2013.01)

(56) References Cited

U.S. PATENT DOCUMENTS

| | | | | |
|---|---|---|---|---|
| 6,426,874 | B2* | 7/2002 | Kajiura | H05K 7/20909 |
| | | | | 165/80.3 |
| 7,009,318 | B2* | 3/2006 | Iritani | F04B 35/04 |
| | | | | 310/52 |
| 7,081,691 | B2* | 7/2006 | Kawata | H05K 1/0203 |
| | | | | 307/9.1 |
| 7,207,187 | B2* | 4/2007 | Funahashi | F01C 21/10 |
| | | | | 62/113 |
| 7,473,079 | B2* | 1/2009 | Ogawa | F01C 21/10 |
| | | | | 417/410.1 |
| 2001/0038526 | A1 | 11/2001 | Kajiura | |
| 2002/0025265 | A1 | 2/2002 | Ikeda | |
| 2009/0151389 | A1* | 6/2009 | Iguchi | F04C 18/0215 |
| | | | | 62/505 |
| 2011/0096473 | A1 | 4/2011 | Wang et al. | |
| 2011/0103979 | A1* | 5/2011 | Taguchi | F04C 23/008 |
| | | | | 417/410.1 |
| 2012/0045353 | A1* | 2/2012 | Watanabe | F04B 35/04 |
| | | | | 417/410.1 |
| 2012/0183420 | A1 | 7/2012 | Taguchi | |
| 2012/0308414 | A1* | 12/2012 | Ogawa | F04B 39/06 |
| | | | | 417/410.5 |

FOREIGN PATENT DOCUMENTS

| | | |
|---|---|---|
| CN | 102686881 A | 9/2012 |
| JP | 5-328710 A | 12/1993 |
| JP | 52-108559 U | 6/2001 |
| JP | 2001-168253 A | 6/2001 |
| JP | 2002-70743 A | 3/2002 |
| JP | 2002-202058 A | 7/2002 |
| JP | 2007-198341 A | 8/2007 |
| JP | 2008-215089 A | 9/2008 |
| JP | 2010-1859 A | 1/2010 |
| JP | 2012-120348 A | 6/2012 |
| JP | 2012-239356 A | 12/2012 |

OTHER PUBLICATIONS

Chinese Office Action and Search Report, dated Mar. 14, 2016, for corresponding Chinese Application No. 201380057270.X, with an English translation.

Foreign Office Action for Chinese Application No. 201380057270.X, dated Jun. 13, 2017, with an English translation.

\* cited by examiner

INVERTER-INTEGRATED ELECTRICAL COMPRESSOR

TECHNICAL FIELD

The present invention relates to an inverter-integrated electrical compressor in which an inverter device is integrally incorporated into the housing of the electrical compressor.

BACKGROUND ART

Inverter-integrated electrical compressors in which an inverter device is integrally incorporated are used as air conditioner compressors installed in electric vehicles, hybrid vehicles, or the like. The inverter-integrated electrical compressor is configured to be driven by converting high-voltage DC power supplied from a power supply unit installed in the vehicle into three-phase AC power of a specified frequency, and applying the converted power to the electric motor.

An inverter device is configured from, e.g., high-voltage electric components, such as inductor coils, smoothing capacitors, and the like, which constitute a noise canceling filter circuit connecting with a high-voltage line, an inverter circuit, which includes a plurality of semiconductor switching elements, such as IGBT (Insulated Gate Bipolar Transistors), that convert direct current power to three-phase alternating current power, a control circuit, which includes a CPU (Central Processing Unit) or the like that controls the inverter circuit with instructions from a host control device, and a busbar or the like that interconnects these subassemblies and is constituted to convert high-voltage direct current power that is input via a P-N terminal into three-phase alternating current power, which is then output from a UVW terminal.

This inverter device is installed inside an inverter-accommodating case that is furnished in the electrical compressor housing, and is constituted to apply three-phase alternating current power from the UVW terminal to an electric motor via a sealed terminal that penetrates the housing. The inverter-accommodating case is established by means of a partitioning wall (housing wall) facing low-pressure refrigerant channels that pass through the interior of the housing, and is constituted so that the semiconductor switching elements and high-voltage electric components of the inverter device assembled in the interior thereof are cooled using this partitioning wall as a heat sink, and is hermetically sealed after the inverter device is assembled therein.

Expensive polyol ester (POE) refrigeration lubricant with high insulating performance is generally used in electrical compressors with a built-in electric motor. However, there are also users that prefer inexpensive polyalkyl glycol (PAG) refrigeration lubricant, which has low insulating performance. In this case, sufficient insulation must be ensured between the sealed terminal and the motor winding. In response to this, Patent Document 1 discloses that it is possible to ensure a sufficient insulating distance and to install an insulation member for the terminals inside the housing by raising the height of the partitioning wall inside the inverter-accommodating case, installing a sealed terminal in that portion.

Also, if cooling performance is ensured by disposing the semiconductor switching elements on the partitioning wall in the technology shown in Patent Document 1, the space for installing the circuit board on which the semiconductor switching elements are mounted is subject to restriction by the raised portion in which the sealed terminal is installed. Therefore, it becomes necessary to divide the circuit board into a power circuit board and a control substrate, requiring a busbar to interconnect the power circuit board and the sealed terminal. Meanwhile, if only one circuit board is used and semiconductor switching elements and high-voltage electric components are mounted thereon, as shown in Patent Document 2, the height of the partitioning wall must be raised to bring the part thereof on which the semiconductor switching elements are mounted closer to the circuit board.

CITATION LISTS

Patent Documents

Patent Document 1: Japanese Unexamined Patent Application Publication No. 2010-1859A
Patent Document 2: Japanese Unexamined Patent Application Publication No. 2007-198341A

SUMMARY OF THE INVENTION

Technical Problem

As described above, in order to use PAG lubricant, the height of the part of the partitioning wall on which the sealed terminal of the partitioning wall is mounted must be raised to ensure insulation, which makes it difficult to use only a single circuit board if cooling performance is to be ensured for the semiconductor switching elements. In addition to this, the number of components is increased because a busbar becomes necessary, and the like, which makes the structure of the inverter device more complex and increases its size, and therefore it was unavoidable that the inverter-integrated electrical compressor became larger and more costly.

There was also a problem in that, in the case of a structure in which a raised portion of the partition wall was furnished on the partitioning wall for mounting the semiconductor switching elements, excessively thick parts are generated in the housing or inverter housing part by increasing the height of the partitioning wall, which is a factor in increasing weight and costs, and the like.

The present invention has been made in view of such circumstances, and an object of the present invention is to provide an inverter-integrated electrical compressor in which an inverter device has fewer components and a simpler configuration, is more compact, and is lower in cost, and the electrical compressor is made smaller, more lightweight, and lower in cost, by using only one circuit board and making it unnecessary for a large installation surface having a raised partitioning wall on which a semiconductor switching elements are installed.

Solution to Problem

The inverter-integrated electrical compressor of the present invention is furnished with low-pressure refrigerant channels and an inverter-accommodating case that is partitioned by a partitioning wall on the interior of a housing, into which a compressor and an electric motor are installed, an inverter device being incorporated and integrated within the inverter-accommodating case; wherein the inverter device is provided with a plurality of high-voltage electric components constituting a filter circuit, a plurality of semiconductor switching elements, and a control substrate on which an inverter circuit and a control circuit are mounted; and the plurality of semiconductor switching elements are installed in a fixed manner on the side face of a heat-radiating block disposed in the vertical direction relative to the partitioning wall.

With this configuration, it becomes unnecessary to ensure a flat mounting surface with a large surface area for installing the plurality of semiconductor switching elements on the wall face of the partitioning wall, and moreover, the semiconductor switching elements can be installed at a position at roughly the same height as the sealed terminal, and the like, for applying power to the other high-voltage electric components and the electric motor. Thus, the control substrate can be constituted from one circuit board with roughly the same surface area as the interior of the inverter-accommodating case, on which the inverter circuit and control circuit are mounted, with a constitution in which the semiconductor switching elements and high-voltage electric components can be mounted thereon, and can be directly connected to the control substrate and sealed terminal. Consequently, the inverter device and inverter-accommodating case can be made smaller, and the inverter-integrated electrical compressor can in turn be made smaller and more lightweight, and at lower cost. There also is no need to interconnect the components of the inverter device by means of a busbar or connectors, which can allow for a simplified configuration and decreased cost. In addition, there is no need to furnish a raised portion of the partitioning wall for installing the semiconductor switching elements, whereby excessively thick portions in the housing or inverter-accommodating case can be decreased, allowing for weight reductions and lower costs.

Furthermore, the inverter-integrated electrical compressor of the present invention is constituted such that the heat-radiating block, in the above inverter-integrated electrical compressor, is a separate member from the partitioning wall, making it possible to install it fastened any position on the partitioning wall.

This configuration makes it possible to install the heat-radiating block at any location corresponding to the layout of the components of the inverter device installed in the inverter-accommodating case. In addition, the heat-radiating block can be installed fastened to the partitioning wall with screws, or the like, after the heat-radiating block has been installed fastened with screws, or the like, with the semiconductor switching elements on the outside. Consequently, the degree of freedom in the layout of the components constituting the inverter device can be increased, and assembly of the semiconductor switching elements to the heat-radiating block can be facilitated.

Furthermore, the inverter-integrated electrical compressor of the present invention is constituted such that the heat-radiating block, in the above inverter-integrated electrical compressor, is formed standing from and integrated with the wall face of the partitioning wall.

This configuration makes it possible to increase thermal transmission efficiency from the heat-radiating block to the partitioning wall over that in which the heat-radiating block was a separate member, by the amount that there is no contact thermal transmission point via a joint. Consequently, the heat dissipation effect and cooling effect can be increased for the semiconductor switching elements installed fastened to the heat-radiating block, preventing overheating and improving the heat resistance of the inverter device.

Furthermore, the inverter-integrated electrical compressor of the present invention is constituted such that the heat-radiating block, in either of the above inverter-integrated electrical compressors, is inclined in such a way that it widens toward the end of the joint thereof with the partitioning wall.

This configuration makes it possible to ensure sufficient heat transfer area from the heat-radiating block to the partitioning wall, increasing the heat dissipation effect. Consequently, the heat dissipation effect and cooling effect can be increased for the semiconductor switching elements installed fastened to the heat-radiating block, preventing overheating and improving the heat resistance of the inverter device.

Furthermore, the inverter-integrated electrical compressor of the present invention is constituted such that the side faces of the heat-radiating block, on which the semiconductor switching elements are fastened and installed, in any of the above inverter-integrated electrical compressors, are vertical faces or inclined faces that perpendicularly or obliquely intersect the partitioning wall.

This configuration makes it possible to install the plurality of semiconductor switching elements in three dimensions inside the inverter-accommodating case, minimizing the planar area of the installation area needed to install the semiconductor switching elements. Consequently, the inverter device and inverter-accommodating case can be made smaller and more compact, and the inverter-integrated electrical compressor can in turn be made smaller and more lightweight, and at lower cost. Additionally, making the side faces of the heat-radiating block inclined faces facilitates the operation of tightening the screws or the like when fastening and installing the semiconductor switching elements to the heat-radiating block.

Furthermore, the inverter-integrated electrical compressor of the present invention is constituted such that the high-voltage electric components and the heat-radiating block, in any of the above inverter-integrated electrical compressors, are disposed on the wall face of the partitioning wall, so that the single control substrate, on which the high-voltage electric components and the semiconductor switching elements are mounted, is installed on the opposite side from the high-voltage electric components and sandwiching the heat-radiating block.

This configuration makes it possible to efficiently cool the plurality of high-voltage electric components installed on the wall face of the partitioning wall and the semiconductor switching elements installed by means of the heat-radiating block using the partitioning wall, which is cooled by the low-pressure refrigerant flowing through the low-pressure refrigerant channels, as a heat sink. In addition, the desired filter circuit and inverter circuit can be configured by installing one control substrate, on which the inverter circuit and control circuit are mounted on opposite sides thereof, and mounting the high-voltage electric components and semiconductor switching elements on this circuit board, connected by a wiring pattern. Consequently, a busbar or connectors are unnecessary between the components of the inverter device, which allows for fewer components, a simplified configuration, and easier assembly, and the like, making it possible to make the inverter device and inverter-accommodating case smaller, and the inverter-integrated electrical compressor can in turn be made smaller and more lightweight, and at lower cost.

Furthermore, the inverter-integrated electrical compressor of the present invention is constituted such that a sealed terminal, for applying power converted by the inverter device from direct current power to three-phase alternating current power of a specified frequency to the electric motor, is installed penetrating the partitioning wall inside the inverter-accommodating case in any of the above inverter-integrated electrical compressors, and this sealed terminal and the control substrate are directly connected.

This configuration makes a three-phase UVW busbar, or the like, unnecessary to output three-phase alternating current power converted by the inverter device to the sealed terminal (glass sealed terminal). Consequently, in the inverter-integrated electrical compressor, the number of components is reduced, the configuration is simplified and assembly is made easier.

Furthermore, the inverter-integrated electrical compressor of the present invention is constituted such that the sealed terminal, in any of the above inverter-integrated electrical compressors, is disposed on a terminal installation part in which the height of the wall face of the partitioning wall, on which the high-voltage electric components and the heat-radiating block are installed, is raised in one portion, such that the specified insulating distance can be ensured between the inner end of the terminal and the motor winding.

This configuration makes it possible to provide sufficient insulation between the inner end of the terminal and the motor winding inside the housing in which electric motor is installed, ensuring the insulating performance therebetween. Consequently, the required insulating performance can be ensured, even when using a polyalkyl glycol (PAG) refrigeration lubricant with low insulating performance.

Advantageous Effects of Invention

Installing a plurality of semiconductor switching elements secured to the side faces of a heat-radiating block that are disposed in the vertical direction relative to a partitioning wall according to the present invention makes it unnecessary to ensure a flat installation surface with a large surface area for installing the plurality of semiconductor switching elements on the wall face of the partitioning wall. Moreover, the semiconductor switching elements can be installed at a position at roughly the same height as the sealed terminal, and the like, for applying power to the other high-voltage electric components and the electric motor. Thus, the control substrate can be constituted from one circuit board with roughly the same surface area as the interior of the inverter-accommodating case, on which the inverter circuit and control circuit are mounted, with a constitution in which the semiconductor switching elements and high-voltage electric components can be mounted thereon, and can be directly connected to the control substrate and sealed terminal. Therefore, the inverter device and inverter-accommodating case can be made smaller, and the inverter-integrated electrical compressor can in turn be made smaller and more lightweight, and at lower cost. There also is no need to interconnect the components of the inverter device by means of a busbar or connectors, which can allow for a simplified configuration and decreased cost. In addition, there is no need to furnish a raised portion of the partitioning wall for installing the semiconductor switching elements, whereby excessively thick portions in the housing or inverter-accommodating case can be decreased, allowing for weight reductions and lower costs.

DESCRIPTION OF EMBODIMENTS

Embodiments of the present invention will be described below, referring to the attached drawings.

First Embodiment

A first embodiment of the present invention will be described below, using FIG. 1 to FIG. 5.

Figure 1:
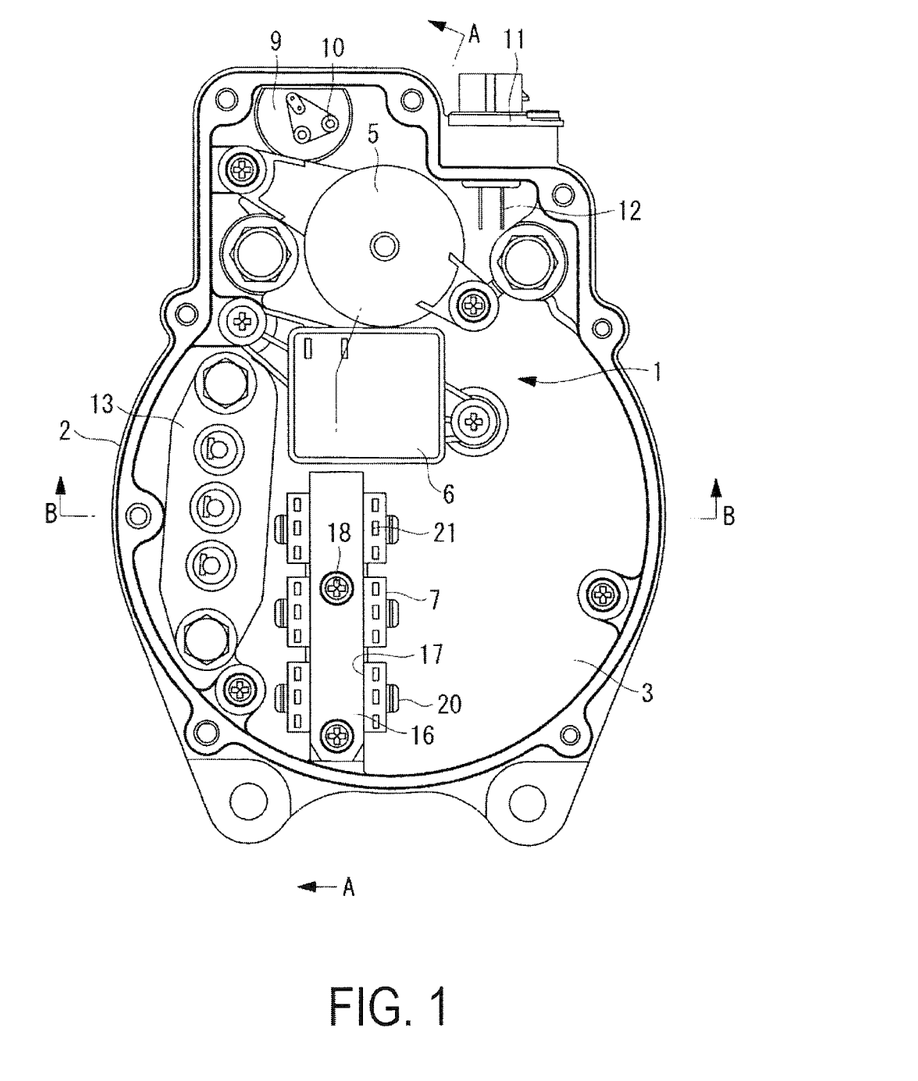
FIG. 1 is a plan view of the state in which the inverter-accommodating case cover member and control substrate are removed from the inverter-integrated electrical compressor of a first embodiment of the present invention.
Figure 2:
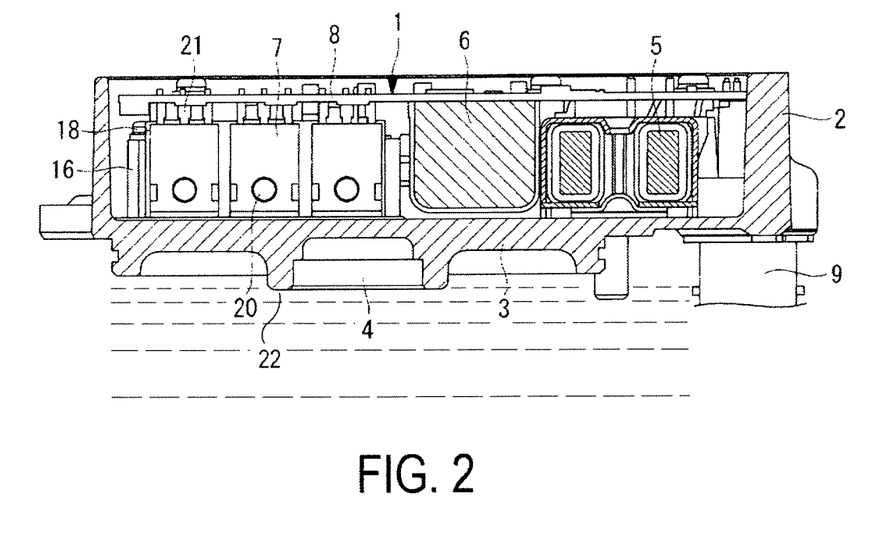
FIG. 2 is a corresponding cross-sectional view along the line A-A, including the control substrate, in FIG. 1.
Figure 3:
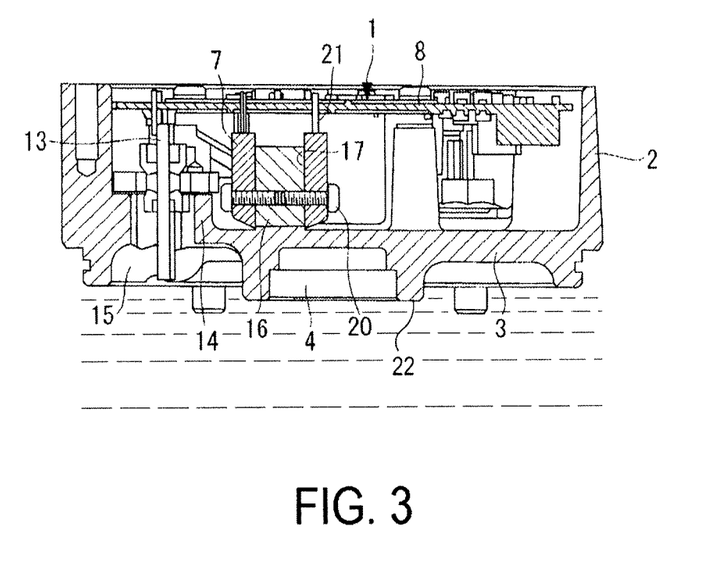
FIG. 3 is a corresponding cross-sectional view along the line B-B, including the control substrate, in FIG. 1.

An inverter-integrated electrical compressor is constituted with an inverter device 1 integrally assembled into an electrical compressor housing, into which a compressor and the electric motor that drives it have been installed, wherein the electric motor is driven by the inverter device 1. The inverter device 1 is integrally assembled into a die cast aluminum housing for an electrical compressor, or is installed housed inside an integrally formed die case aluminum inverter-accommodating case 2, and made into an integral unit with the electrical compressor.

The inverter-accommodating case 2 is shaped with a cylindrical portion protruding in a square shape in the radial direction, where the cylindrical portion is integrally constituted by being joined to the cylindrical housing of the electrical compressor. The bottom face of the inverter-accommodating case 2 forms a partitioning wall 3 that is a roughly flat surface, where the partitioning wall 3 seals one end of the electrical compressor housing, dividing it into the inside of the housing and the inside of the inverter-accommodating case 2.

The housing side of the partitioning wall 3 is a housing and installation part for the electric motor, which constitutes a coolant channel through which flows low-pressure refrigerant gas taken in from a refrigerant intake port disposed on the housing side. Additionally, a bearing installation part 4, which supports the rotary shaft of the electric motor, is disposed in the end face of the housing side of the partitioning wall 3.

The inverter device 1 converts high-voltage direct current power supplied from a power source unit installed in the vehicle to three-phase alternating current of a specified frequency and applies it to the electric motor, thereby driving the motor, and is integrally assembled into the inverter-accommodating case 2, as shown in FIG. 1 to FIG. 3. The inverter-accommodating case 2 is constituted to be sealed by a cover after the inverter device 1 has been housed and installed.

The inverter device 1 is constituted from a plurality of high-voltage components, such as an encased inductor coil 5, smoothing capacitor 6, and the like, which constitute a noise-canceling filter circuit that is connected to the direct current high-voltage line, a plurality (6) of semiconductor switching elements (power elements) 7, such as IGBT, that constitute the inverter circuit, which converts direct current power to three-phase alternating current power of a specified frequency, and applies the same to the electric motor, and a control substrate 8, on which is mounted this filter circuit and inverter circuit, as well as a control circuit that operates at low voltage, such as a CPU, which controls the inverter circuit, and the like.

The inverter device 1 itself may be a known device, but is an inverter device 1 that uses one control substrate 8 wherein, in addition to a control circuit that controls the inverter circuit with instructions from a host control device, a filter circuit is also constituted by mounting an inductor coil 5 and smoothing capacitor 6 and connecting the same with a wiring pattern on the control substrate 8, and an inverter circuit is constituted by mounting a plurality of semiconductor switching elements 7 on the control substrate 8.

The control substrate 8 is constituted as a circuit board of a size S (see FIG. 4) that covers roughly the entire surface of the inverter-accommodating case 2, which is installed housed on the interior of thereof above, i.e., on the side opposite the partitioning wall 3, of the inductor coil 5, smoothing capacitor 6, plurality of semiconductor switching elements 7, and sealed terminal (glass sealed terminal) 13 described below, which are mounted on the inverter-accommodating case 2 side of the partitioning wall 3, as described below.

High-voltage direct current power from the power source unit is input via a cable and connector 9, through a P-N terminal 10, to a high-voltage line on the control substrate 8. Additionally, instructions from the host control device are input to the control circuit on the control substrate 8 from a terminal 12, via a signal line and connector 11. Furthermore the three-phase alternating current power of a specified frequency converted by the inverter device 1 is output directly from the control substrate 8 to the sealed terminal (glass sealed terminal) 13 disposed to penetrate the partitioning wall 3 inside the inverter-accommodating case 2, and supplied via the sealed terminal 13 to the electric motor on the housing side.

The sealed terminal (glass sealed terminal) 13 is installed in a terminal installation part 14 formed by raising the height of a portion on the inverter-accommodating case 2 side of the partitioning wall 3, thereby forming a void 15 of a specified size in the housing side, in order to ensure sufficient insulating distance from the motor winding of the electric motor on the housing side, and to make it possible to install the necessary insulating member, and the like.

Additionally, the high-voltage inductor coil 5 and smoothing capacitor 6, and the semiconductor switching elements (power elements) 7, and the like, that constitute the inverter device 1 are heat-generating parts and require cooling. Therefore, these components are installed touching the partitioning wall 3, as shown in FIG. 2. Because the partitioning wall 3 is made from die cast aluminum, and is cooled by low-pressure refrigerant gas by the surface thereof on the housing side touching low-pressure refrigerant gas channels 22 (see FIGS. 2, 3, 6, and 7) as described above, it is constituted as a heat sink that is capable of cooling the various heat-generating components above.

In particular, installing the plurality of semiconductor switching elements (power elements) 7 directly touching the surface of the partitioning wall 3, results in the plurality of semiconductor switching elements (power elements) 7 being installed taking up a large surface area and being separated from the control substrate 8. Therefore, an aluminum alloy heat-radiating block 16 is disposed standing on the surface of the partitioning wall 3 in vertical direction relative to the partitioning wall 3, in a constitution such that a plurality (3) of the semiconductor switching elements (power elements) 7 is installed secured on each of the surfaces 17 that are the vertical faces of the heat-radiating block 16.

Figure 4:
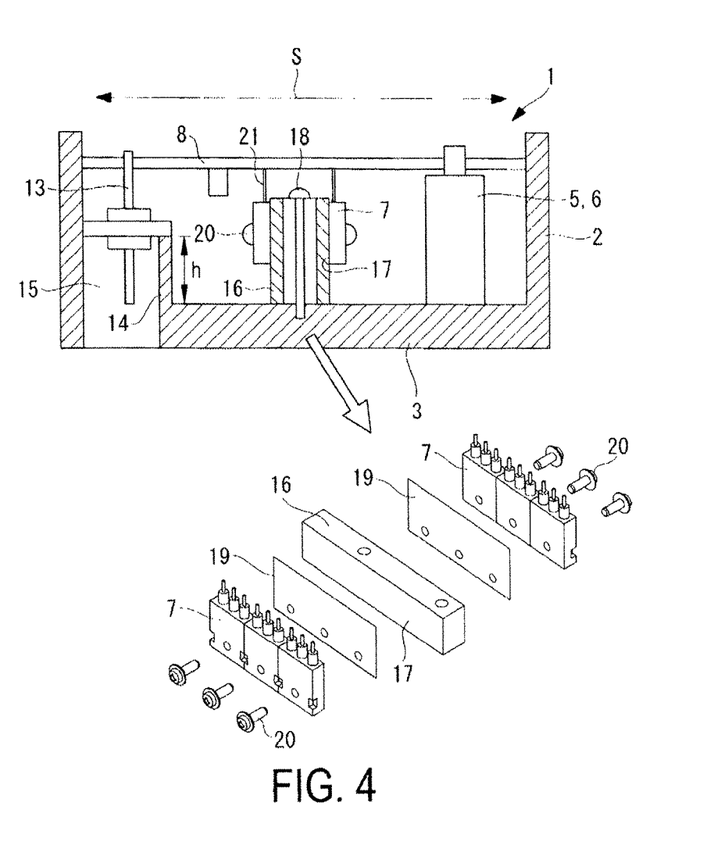
FIG. 4 is a partially exploded illustration of the configuration schematically representing FIG. 3.

The heat-radiating block 16 is constituted in the present embodiment as a separate member from the partitioning wall 3, which is secured to the partitioning wall 8 with screws 18 so that it is firmly attached thereto. Each three of the semiconductor switching elements (power elements) 7 that constitute an upper arm and lower arm of the inverter circuit (switching circuit) are securely screwed in place with screws 20, incorporating intervening insulation sheets 19, to both surfaces of the heat-radiating block 16, as shown in FIG. 4. The terminals 21 of the semiconductor switching elements (power elements) 7 extend straight toward the control substrate 8, and are soldered to the control substrate 8.

Further, the aluminum alloy heat-radiating block 16 may have inclined surfaces such that both surfaces 17 that are vertical faces widen toward the joints with the partitioning wall 3 to increase the contact surface thereof with the partitioning wall 3 and to ensure sufficient heat transfer surface area from the heat-radiating block 16 to the partitioning wall 3, increasing the heat dissipation effect on the semiconductor switching elements 7.

According to the configuration as described above, the present embodiment has the following action and effects.

While the air conditioner is operating, high-voltage direct current power from a power source unit installed in the vehicle is input to the inverter device 1 of an inverter-integrated electrical compressor via a power source cable. Direct current power input to a filter circuit on a control substrate 8 via a connector 9 and P-N terminal 10 is passed through an inductor coil 5 and smoothing capacitor 6 to reduce high-frequency noise and current ripples, and is then input to an inverter circuit, which is constituted by a plurality of semiconductor switching elements 7.

In the inverter circuit, direct current power is converted to three-phase alternating current power of a specified frequency by the switching operation of the semiconductor switching elements 7, which are operated by instructions from a control circuit, and the AC power is output from a UVW output part on the control substrate 8 to a sealed terminal 13, which is directly connected to the control substrate 8. The sealed terminal 13 penetrates the housing and applies the three-phase alternating current of a specified frequency to an electric motor installed on the interior thereof, rotationally driving the electric motor and driving the compressor.

Low-pressure refrigerant gas taken into the housing from an intake port by the compressor being driven flows through along a partitioning wall 3 in an inverter-accommodating case 2, and then is taken into the compressor via the electric motor stator and channels within the housing and compressed to a high pressure and discharged toward a refrigerant circuit. The partitioning wall 3 is cooled by the flow of this low-pressure refrigerant gas, and the partitioning wall 3 acts as a heat sink to cool the inductor coil 5 and smoothing capacitor 6 installed touching the partitioning wall 3, and the semiconductor switching elements (power elements) 7, and the like, that are installed via a heat-radiating block 16, so thereby ensuring the heat resistance of the inverter device 1.

Figure 5:
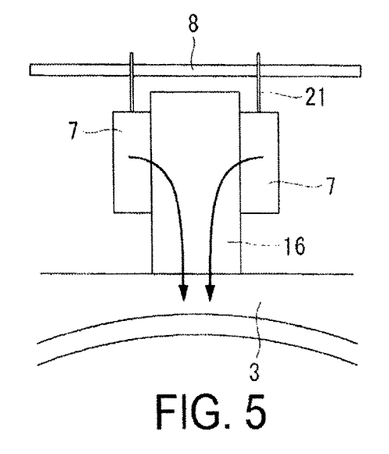
FIG. 5 is a schematic view representing the heat dissipation condition of heat from the semiconductor switching elements.

FIG. 5 shows the heat dissipation pathways for the semiconductor switching elements (power elements) 7. Heat generated in the semiconductor switching elements 7 by switching operations is thermally transmitted to the heat-radiating block 16, made from a highly heat conductive aluminum alloy material, and is then dissipated to the low-temperature partitioning wall 3, which is cooled by the low-pressure refrigerant, and further dissipated from the partitioning wall 3 to the refrigerant, and thereby forcibly cooled. Thus, all the heat-generating components in the inverter device 1 that require cooling are cooled and the heat resistance thereof is ensured.

Meanwhile, since the sealed terminal 13 is installed in a terminal installation part 14, which is a raised portion of the partitioning wall 3, a void 15 of a specified size is formed in the housing and the sealed terminal can be installed. Thus, sufficient insulating distance can be ensured from the motor winding of the electric motor in the interior of the housing, and the void 15 can be used to install a required insulation member. Therefore, it is possible to use an inexpensive polyalkyl glycol (PAG) refrigeration lubricant with low insulating performance, expanding the choices in refrigeration lubricant available to the user.

Additionally, the plurality of semiconductor switching elements 7 that constitute the inverter device 1 are constituted installed fastened to the side faces 17 of the heat-radiating block 16, which is disposed in vertical direction relative to the partitioning wall 3, which partitions the interior of the housing and the inverter-accommodating case 2. Therefore, not only can cooling performance be ensured for the semiconductor switching elements 7, as described above, but there is also no need to ensure a flat mounting surface with a large surface area for installing the plurality of semiconductor switching elements 7 on the wall face of the partitioning wall 3. Moreover, the semiconductor switching elements 7 can be installed at a position at roughly the same height as the sealed terminal 13, and the like, for applying power to the other high-voltage electric components, such as the inductor coil 5 and smoothing capacitor 6, and the electric motor.

Thus, the control substrate 8 can be constituted from one circuit board with roughly the same surface area as the interior of the inverter-accommodating case 2, on which the inverter circuit and control circuit are mounted, with a constitution in which the semiconductor switching elements 7 and high-voltage electric components, such as the inductor coil 5 and smoothing capacitor 6, can be mounted thereon, and can be directly connected to the control substrate 8 and sealed terminal 13.

Therefore, the inverter device 1 and inverter-accommodating case 2 can be made smaller, and the inverter-integrated electrical compressor can in turn be made smaller and more lightweight, and at lower cost. There also is no need to interconnect the components of the inverter device 1 by means of a busbar or connectors, which can allow for a simplified configuration and decreased cost. In addition, there is no need to furnish a raised portion of the partitioning wall 3 for installing the semiconductor switching elements 7, whereby excessively thick portions in the housing or inverter-accommodating case 2 can be decreased, allowing for weight reductions and lower costs.

Also, the heat-radiating block 16 is constituted in the present embodiment as a separate member from the partitioning wall 3, and can be installed fastened to the partitioning wall 3 at any location. Therefore, the heat-radiating block 16 can be installed at any location corresponding to the layout of the components of the inverter device 1 installed in the inverter-accommodating case 2. In addition, the heat-radiating block 16 can be installed fastened with screws 20, or the like, with the semiconductor switching elements 7 on the outside, and then the heat-radiating block 16 can be installed fastened with screws 18, or the like, to the partitioning wall 3. Thus, the degree of freedom in the layout of the components constituting the inverter device 1 can be increased, and assembly of the semiconductor switching elements 7 to the heat-radiating block 16 can be facilitated.

Furthermore, sufficient heat transfer surface area from the heat-radiating block 16 to the partitioning wall 3 can be ensured, and the heat dissipation effect on the semiconductor switching elements 7 can be increased by making the joints between the heat-radiating block 16 and the partitioning wall 3 inclined faces that widen toward the end. Therefore, the heat dissipation effect on the semiconductor switching elements 7 installed fastened to the heat-radiating block 16 can be increased, preventing overheating and improving the heat resistance of the inverter device.

Additionally, in the present embodiment, both surfaces 17 of the heat-radiating block 16 on which the semiconductor switching elements 7 are installed are vertical faces that intersect the partitioning wall 3. Therefore, the plurality of semiconductor switching elements 7 can be installed in three dimensions inside the inverter-accommodating case 2, minimizing the planar area of the installation area needed to install the semiconductor switching elements 7. Thus, the inverter device 1 and inverter-accommodating case 2 can be made smaller and more compact, and the inverter-integrated electrical compressor can in turn be made smaller and more lightweight, and at lower cost.

Additionally, the plurality of high-voltage electric components (inductor coil 5, smoothing capacitor 6, and the like) and the heat-radiating block 16 are disposed on the wall face of the partitioning wall 3, and constituted so that a single control substrate 8, on which the high-voltage electric components 5, 6 and the semiconductor switching elements 7 are mounted, is installed on the opposite side from the high-voltage electric components 5, 6 and sandwiching the heat-radiating block 16. Therefore, the partitioning wall 3, which is cooled by low-pressure refrigerant flowing through the low-pressure refrigerant channels, acts as a heat sink to efficiently cool the plurality of high-voltage electric components 5, 6 and semiconductor switching elements 7, installed via the heat-radiating block 16, that are installed on the wall face of the partitioning wall 3. In addition, a single control substrate 8, on which an inverter circuit and control circuit are mounted on opposite sides thereof, is installed, wherein the specified filter circuit and inverter circuit can be constituted by mounting high-voltage electric components 5, 6 and semiconductor switching elements 7 on the control substrate 8, connected by a wiring pattern.

Thus, a busbar or connectors are unnecessary between the components of the inverter device 1, which allows for fewer components, a simplified configuration, and easier assembly, and the like, making it possible to make the inverter device 1 and inverter-accommodating case 2 smaller, and the inverter-integrated electrical compressor can in turn be made smaller and more lightweight, and at lower cost.

Furthermore, a sealed terminal, (glass-sealed terminal) 13, for applying power converted by the inverter device 1 from direct current power to three-phase alternating current power of a specified frequency to the electric motor, is constituted installed penetrating the partitioning wall 3 inside the inverter-accommodating case 2, and with the sealed terminal 13 and control substrate 8 are directly connected. Therefore, a UVW busbar, or the like, is not needed to output the three-phase alternating current power converted by the inverter device 1 to the sealed terminal 13. This allows for fewer of these components, a simplified configuration, and easier assembly in the inverter-integrated electrical compressor.

Second Embodiment

A second embodiment of the present invention will be described below, using FIG. 6.

The present embodiment differs from the first embodiment above in that the heat-radiating block 16A is formed integrated with the partitioning wall 3. Other points are the similar to the first embodiment, so their descriptions are omitted here.

Figure 6:
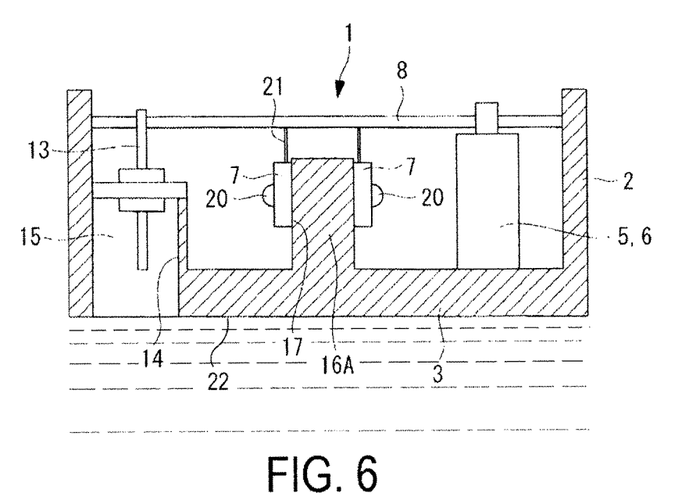
FIG. 6 is an illustration of the configuration corresponding to FIG. 4 related to a second embodiment of the present invention.

In the present embodiment, a heat-radiating block 16A, which rises vertically from the partitioning wall 3 of the inverter-accommodating case 2, is constituted integrally formed with the partitioning wall 3, as shown in FIG. 6.

Thus, by constituting the heat-radiating block 16A integrally formed rising from the partitioning wall 3, thermal transmission efficiency from the heat-radiating block 16A to the partitioning wall 3 is increased over that of the first embodiment, in which the heat-radiating block 16 was a separate member, by the amount that there is no contact thermal transmission point via a joint. Therefore, the heat dissipation effect and cooling effect can be increased for the semiconductor switching elements 7 installed fastened to the heat-radiating block 16A, preventing overheating and improving the heat resistance of the inverter device 1.

Third Embodiment

A third embodiment of the present invention will be described below, using FIG. 7.

The present embodiment differs from the first and second embodiments above in that the surfaces of the heat-radiating block 16B to which the semiconductor switching elements 7 are attached and installed are inclined faces 17A. Other points are the similar to the first and second embodiments, so their descriptions are omitted here.

Figure 7:
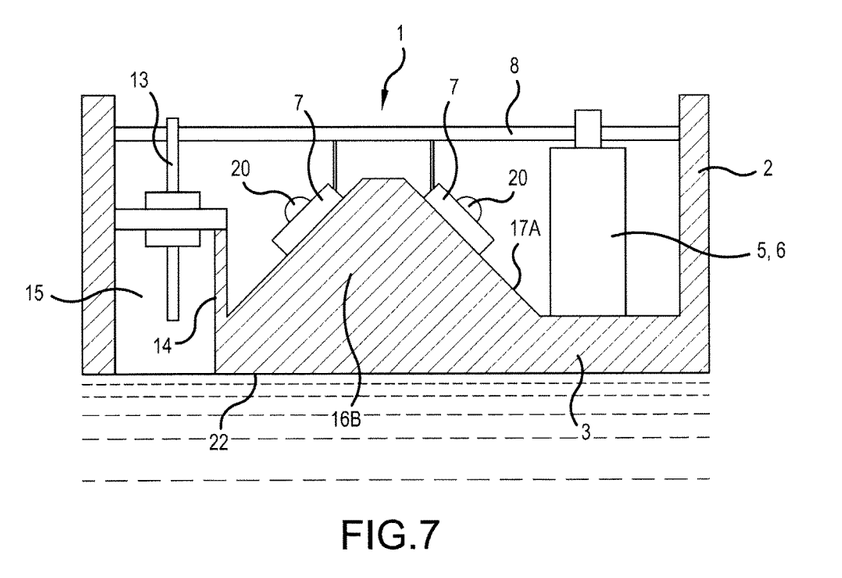
FIG. 7 is an illustration of the configuration corresponding to FIG. 4 related to a third embodiment of the present invention.

In the present embodiment, both surfaces 17 of a heat-radiating block 16B, which rises vertically from the partitioning wall 3 of the inverter-accommodating case 2, to which semiconductor switching elements 7 are attached and installed, are inclined faces 17A that incline so as to widen toward the ends, as shown in FIG. 7.

Figure 8:
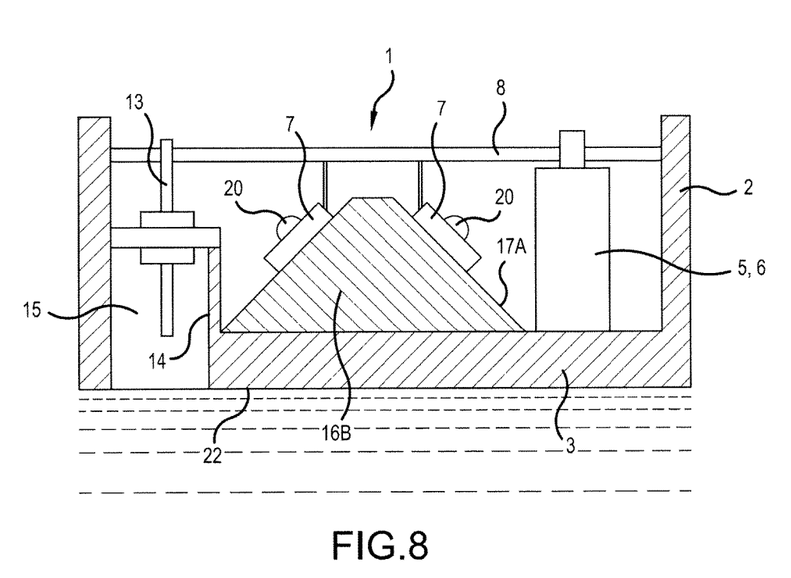
FIG. 8 is an illustration of another configuration corresponding to FIG. 4.

Thus, by making the surfaces 17 of a heat-radiating block 16B to which the semiconductor switching elements 7 are attached and installed inclined faces 17A, sufficient thermal transmission surface area can be ensured from the heat-radiating block 16B to the partitioning wall 3 and heat dissipation effect can be increased, while increasing the flat surface area of the installation area needed for installing the semiconductor switching elements 7 over that of when the surfaces 17 are vertical faces. In addition, the operation of tightening the screws 20 or the like when fastening and installing the semiconductor switching elements 7 to the heat-radiating block 16B is facilitated. Further, the heat-radiating block 16B may be constituted integral with or as a separate member from the partitioning wall 3 (as shown in FIG. 8) in the case of the present embodiment.

Note that the present invention is not limited to the invention according to the embodiment as described above, and changes can be made as appropriate without departing from the gist thereof. For example, examples were described in the above embodiments in which an inductor coil was furnished in a noise-canceling filter circuit as the inverter device 1, but a common mode coil may also otherwise be furnished to reduce common mode noise. In this case, the common mode coil could be installed in the same manner as the inductor coil 5.

Furthermore, examples were described in the above embodiments in which the partitioning wall 3 was furnished integrated into the inverter-accommodating case 2, but the partitioning wall 3 could also be constituted furnished integrated into the housing into which the electric motor is installed and housed. Additionally, the inverter-accommodating case 2 in the above embodiments was disposed at one end of a cylindrical housing, but the present invention is not necessarily limited to such embodiments. The inverter-accommodating case 2 may be disposed on the outer circumference of the housing, and the partitioning wall may be constituted by an external circumferential wall of the housing.

REFERENCE SIGNS LIST

1 Inverter device
2 inverter-accommodating case
3 Partitioning wall
5 Inductor coil (high-voltage system electrical component)
6 Smoothing capacitor (high-voltage system electrical component)
7 Semiconductor switching element (power element)
8 Control substrate
13 Sealed terminal
14 Terminal installation part
16, 16A, 16B Heat-radiating block
17 Side faces of heat-radiating block (vertical faces)
17A Inclined face

The invention claimed is:

1. An inverter-integrated electrical compressor furnished with:
   low-pressure refrigerant channels and an inverter-accommodating case partitioned by a partitioning wall on an interior of a housing, the housing having a compressor and an electric motor installed therein, and the low-pressure refrigerant channels being defined by the partitioning wall, and
   an inverter device incorporated and integrated within the inverter-accommodating case;
   the inverter device being provided with a plurality of high-voltage electric components constituting a filter circuit, a plurality of semiconductor switching elements, and a control substrate having an inverter circuit and a control circuit mounted thereon,
   the plurality of semiconductor switching elements being installed in a fixed manner on side faces of a heat-radiating block disposed in a vertical direction relative to the partitioning wall; and
   a sealed terminal, for applying power converted by the inverter device from direct current power to three-phase alternating current power of a specified frequency to the electric motor,
   installed penetrating the partition wall inside the inverter-accommodating case, the sealed terminal being directly connected to the control substrate, wherein
   the inverter-accommodating case includes a terminal installation part on which the sealed terminal is disposed,
   the terminal installation part is formed by raising a height of one portion of a face of the partitioning wall, on which the high-voltage electric components and the heat-radiating block are installed, and a specified insulating distance can be ensured between the sealed terminal and a motor winding, at an inner end of the sealed terminal, and wherein the sealed terminal and the filter circuit are located on opposite sides of the heat-radiating block such that the heat radiating block is located between the sealed terminal and the filter circuit.

2. The inverter-integrated electrical compressor according to claim 1, wherein the heat-radiating block is a separate member from the partitioning wall able to be installed fastened at any location on the partitioning wall.

3. The inverter-integrated electrical compressor according to claim 2, wherein the heat-radiating block is constituted to be inclined with respect to the partitioning wall so as to widen toward the end of the heat-radiating block.

4. The inverter-integrated electrical compressor according to claim 2, wherein the side faces of the heat-radiating block, to which the semiconductor switching elements are attached and installed, are vertical faces or inclined faces that perpendicularly intersect or obliquely intersect the partitioning wall.

5. The inverter-integrated electrical compressor according to claim 2, wherein the high-voltage electric components and the heat-radiating block are disposed on the face of the partitioning wall, and the control substrate, on which the high-voltage electric components and the semiconductor switching elements are mounted on opposite sides, is installed with the high-voltage electric components on the opposite side, sandwiching the heat-radiating block.

6. The inverter-integrated electrical compressor according to claim 1, wherein the heat-radiating block is integrally formed rising from the partitioning wall.

7. The inverter-integrated electrical compressor according to claim 6, wherein the heat-radiating block is constituted to be inclined with respect to the partitioning wall so as to widen toward the end of the heat-radiating block.

8. The inverter-integrated electrical compressor according to claim 6, wherein the side faces of the heat-radiating block, to which the semiconductor switching elements are attached and installed, are vertical faces or inclined faces that perpendicularly intersect or obliquely intersect the partitioning wall.

9. The inverter-integrated electrical compressor according to claim 6, wherein the high-voltage electric components and the heat-radiating block are disposed on the face of the partitioning wall, and the control substrate, on which the high-voltage electric components and the semiconductor switching elements are mounted on opposite sides, is installed with the high-voltage electric components on the opposite side, sandwiching the heat-radiating block.

10. The inverter-integrated electrical compressor according to claim 1, wherein the heat-radiating block is constituted to be inclined with respect to the partitioning wall so as to widen toward the end of the heat-radiating block.

11. The inverter-integrated electrical compressor according to claim 10, wherein the side faces of the heat-radiating block, to which the semiconductor switching elements are attached and installed, are vertical faces or inclined faces that perpendicularly intersect or obliquely intersect the partitioning wall.

12. The inverter-integrated electrical compressor according to claim 10, wherein the high-voltage electric components and the heat-radiating block are disposed on the face of the partitioning wall, and the control substrate, on which the high-voltage electric components and the semiconductor switching elements are mounted on opposite sides, is installed with the high-voltage electric components on the opposite side, sandwiching the heat-radiating block.

13. The inverter-integrated electrical compressor according to claim 1, wherein the side faces of the heat-radiating block, to which the semiconductor switching elements are attached and installed, are vertical faces or inclined faces that perpendicularly intersect or obliquely intersect the partitioning wall.

14. The inverter-integrated electrical compressor according to claim 13, wherein the high-voltage electric components and the heat-radiating block are disposed on the face of the partitioning wall, and the control substrate, on which the high-voltage electric components and the semiconductor switching elements are mounted on opposite sides, is installed with the high-voltage electric components on the opposite side, sandwiching the heat-radiating block.

15. The inverter-integrated electrical compressor according to claim 1, wherein the high-voltage electric components and the heat-radiating block are disposed on the face of the partitioning wall, and the control substrate, on which the high-voltage electric components and the semiconductor switching elements are mounted on opposite sides, is installed with the high-voltage electric components on the opposite side, sandwiching the heat-radiating block.

* * * * *